United States Patent
Itoh et al.

(10) Patent No.: US 9,693,470 B2
(45) Date of Patent: Jun. 27, 2017

(54) ELECTRIC DEVICE WITH SURROUNDING PROTECTIVE FRAME

(71) Applicant: HITACHI KOKI CO., LTD., Tokyo (JP)

(72) Inventors: Takafumi Itoh, Hitachinaka (JP); Masanori Okada, Hitachinaka (JP); Rui Akiba, Hitachinaka (JP); Masato Sakai, Hitachinaka (JP)

(73) Assignee: Hitachi Koki Co., Ltd., Tokyo (JP)

( * ) Notice: Subject to any disclaimer, the term of this patent is extended or adjusted under 35 U.S.C. 154(b) by 94 days.

(21) Appl. No.: 14/294,956

(22) Filed: Jun. 3, 2014

(65) Prior Publication Data
US 2015/0043138 A1    Feb. 12, 2015

(30) Foreign Application Priority Data

Jun. 14, 2013 (JP) ................... 2013-125495
Jun. 14, 2013 (JP) ................... 2013-125988

(51) Int. Cl.
| | |
|---|---|
| H05K 5/00 | (2006.01) |
| H05K 5/02 | (2006.01) |
| H04R 1/02 | (2006.01) |
| H04B 1/3888 | (2015.01) |

(52) U.S. Cl.
CPC ......... *H05K 5/0017* (2013.01); *H04B 1/3888* (2013.01); *H04R 1/02* (2013.01); *H05K 5/0217* (2013.01)

(58) Field of Classification Search
None
See application file for complete search history.

(56) References Cited

U.S. PATENT DOCUMENTS

| | | | | | |
|---|---|---|---|---|---|
| 5,025,473 | A | * | 6/1991 | Carlsen, II | H04R 1/26 181/148 |
| 6,142,796 | A | * | 11/2000 | Behl | G06F 1/181 361/679.33 |
| 6,457,996 | B1 | * | 10/2002 | Shih | G06F 1/1626 361/679.15 |
| D479,223 | S | * | 9/2003 | Furusho | D14/196 |
| D487,059 | S | * | 2/2004 | Glasgow | D13/107 |

(Continued)

FOREIGN PATENT DOCUMENTS

| | | |
|---|---|---|
| EM | 001227540-0001 | 10/2010 |
| EP | 1847004 A2 | 10/2007 |

(Continued)

OTHER PUBLICATIONS

United Kingdom Intelletual Property Office Search and Examination Report for patent application GB1409939.4 (Nov. 27, 2014).

(Continued)

*Primary Examiner* — Xanthia C Cunningham
(74) *Attorney, Agent, or Firm* — Kilpatrick Townsend & Stockton LLP

(57) ABSTRACT

An electric device includes: a device body; and a frame guard. The device body has a plurality of surfaces for defining a three-dimensional configuration. The frame guard is configured to guard the device body. The frame guard is connected to the device body and disposed outside the device body. The plurality of surfaces is all disposed inside the frame guard.

16 Claims, 9 Drawing Sheets

(56) References Cited

U.S. PATENT DOCUMENTS

| | | | | |
|---|---|---|---|---|
| D488,438 S * | 4/2004 | Zick | | D13/107 |
| 6,840,791 B2 * | 1/2005 | Hsiu | | H01R 13/501 |
| | | | | 320/107 |
| D538,258 S * | 3/2007 | Ishibashi | | D14/168 |
| D538,782 S * | 3/2007 | Ishibashi | | D14/168 |
| 7,332,889 B2 * | 2/2008 | Glasgow | | H02J 7/0045 |
| | | | | 320/107 |
| D585,822 S * | 2/2009 | Hsu | | D13/107 |
| D587,687 S * | 3/2009 | Dayan | | D14/188 |
| 7,696,721 B2 * | 4/2010 | Young | | H02J 7/0068 |
| | | | | 320/107 |
| 7,778,023 B1 * | 8/2010 | Mohoney | | G06F 1/1632 |
| | | | | 312/223.2 |
| 7,835,534 B2 * | 11/2010 | Cole, Jr. | | A45C 11/20 |
| | | | | 219/717 |
| D653,612 S * | 2/2012 | DuMelle | | D13/107 |
| 8,159,818 B2 * | 4/2012 | Riddiford | | B60R 11/0258 |
| | | | | 312/223.1 |
| D676,418 S * | 2/2013 | Suzuki | | D14/209.1 |
| D677,244 S * | 3/2013 | Funayama | | D14/209.1 |
| 8,395,887 B2 * | 3/2013 | Zhang | | H01R 13/443 |
| | | | | 361/679.01 |
| 8,522,795 B2 * | 9/2013 | Bouix | | A45D 33/008 |
| | | | | 132/212 |
| 8,535,102 B1 * | 9/2013 | Colahan | | H01R 31/06 |
| | | | | 439/5 |
| 8,604,753 B2 * | 12/2013 | Bessa | | H02J 7/0044 |
| | | | | 320/101 |
| 2002/0065054 A1 * | 5/2002 | Humphreys | | H04B 1/3888 |
| | | | | 455/575.1 |
| 2005/0078834 A1 * | 4/2005 | Hirschburger | | H01M 2/1022 |
| | | | | 381/58 |
| 2005/0225288 A1 * | 10/2005 | Cole, Jr. | | H01M 2/1022 |
| | | | | 320/114 |
| 2007/0024237 A1 * | 2/2007 | Cole, Jr. | | A45C 15/00 |
| | | | | 320/107 |
| 2008/0001252 A1 | 1/2008 | Lee et al. | | |
| 2008/0036420 A1 * | 2/2008 | Zeiler | | H02J 7/0027 |
| | | | | 320/107 |
| 2008/0259550 A1 * | 10/2008 | Lien | | B60R 11/0211 |
| | | | | 361/679.02 |
| 2009/0290745 A1 | 11/2009 | Weir et al. | | |
| 2010/0009574 A1 * | 1/2010 | Shi | | H01R 24/58 |
| | | | | 439/638 |
| 2010/0200456 A1 * | 8/2010 | Parkinson | | B29C 33/485 |
| | | | | 206/701 |
| 2011/0134601 A1 * | 6/2011 | Sa | | G06F 1/1632 |
| | | | | 361/679.43 |
| 2011/0188176 A1 * | 8/2011 | Kim | | H05K 7/00 |
| | | | | 361/679.01 |
| 2012/0034819 A1 * | 2/2012 | Chen | | H01R 31/065 |
| | | | | 439/638 |
| 2012/0106069 A1 * | 5/2012 | Strauser | | G06F 1/1632 |
| | | | | 361/679.41 |
| 2012/0138766 A1 * | 6/2012 | Chen | | A47B 23/043 |
| | | | | 248/456 |
| 2013/0163186 A1 * | 6/2013 | Mizusawa | | H05K 7/14 |
| | | | | 361/679.41 |
| 2013/0336510 A1 * | 12/2013 | Lee | | G06F 1/1632 |
| | | | | 381/333 |

FOREIGN PATENT DOCUMENTS

| | | | | |
|---|---|---|---|---|
| JP | 52-131936 U | | 10/1977 | |
| JP | 2000-092726 A | | 3/2000 | |
| JP | 2007-511931 A | | 5/2007 | |
| JP | 2008-092345 A | | 4/2008 | |
| JP | 2011-166254 A | | 8/2011 | |
| JP | 2012-011791 A | | 1/2012 | |
| JP | 1431462 S | | 1/2012 | |
| KR | 1020130142250 | * | 12/2013 | G06F 13/14 |

OTHER PUBLICATIONS

French Patent Office Partial Preliminary Search Report dated Jul. 21, 2016 for patent application FR1455354.

Japan Patent Office office actions JPO patent application 2013-125495 (Dec. 1, 2016).

* cited by examiner

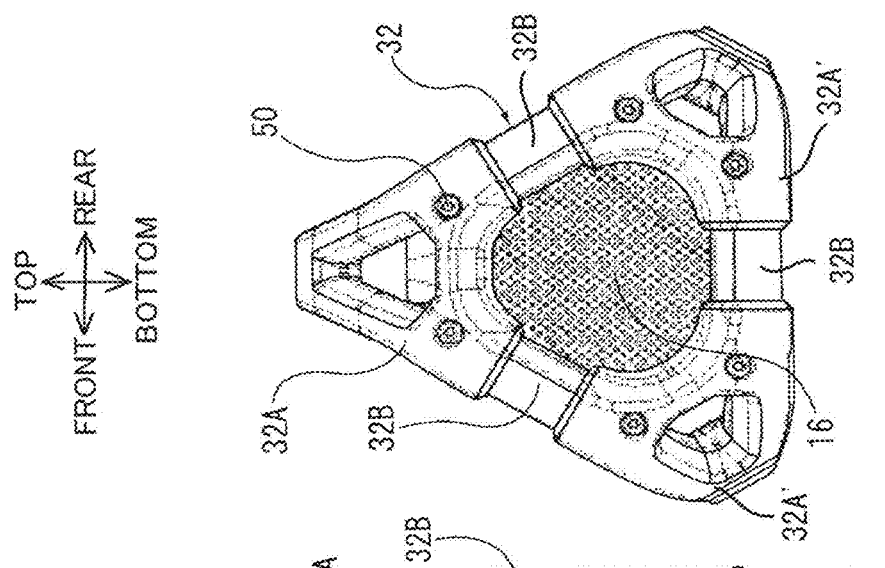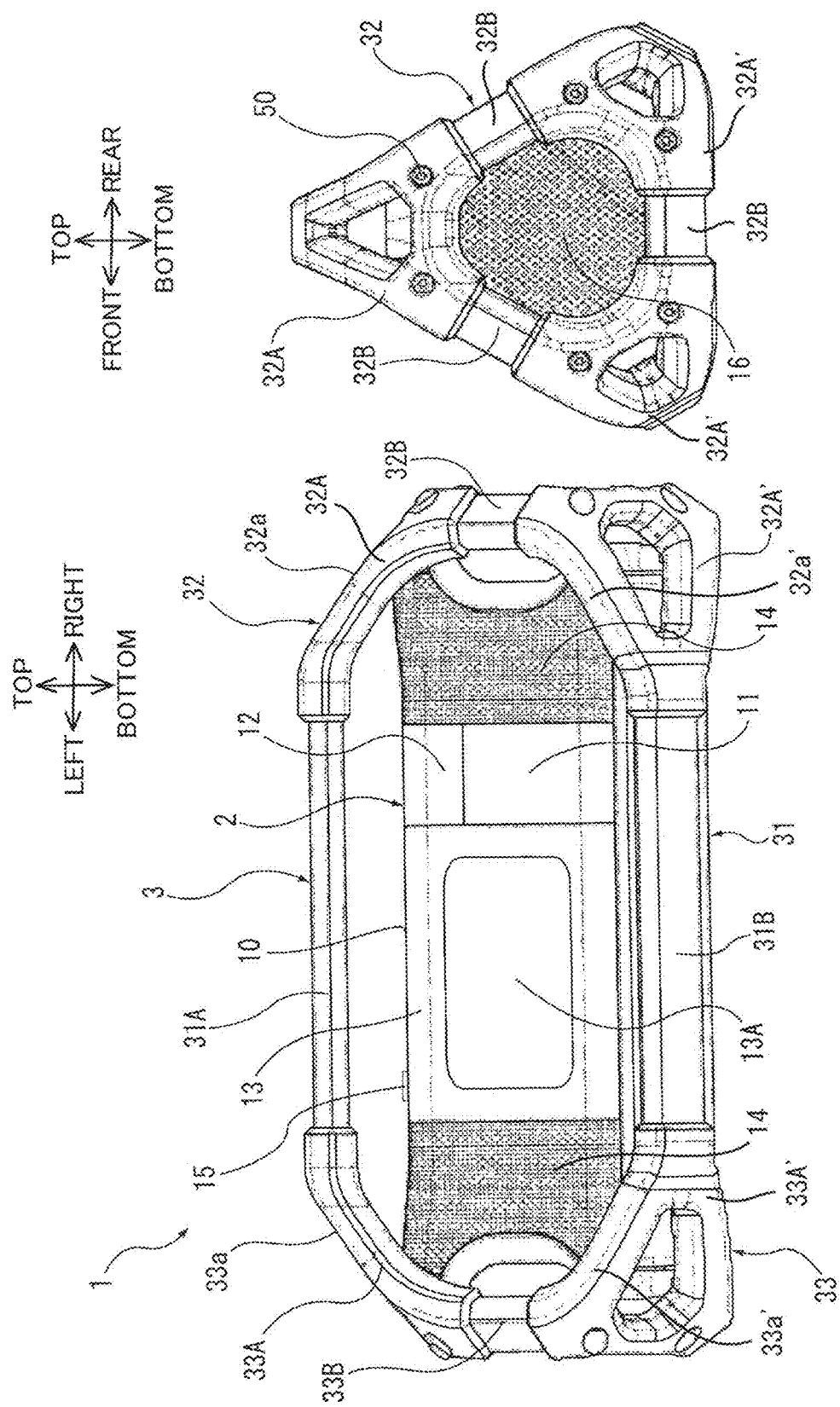

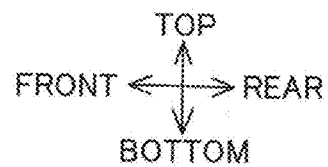
FIG.4A 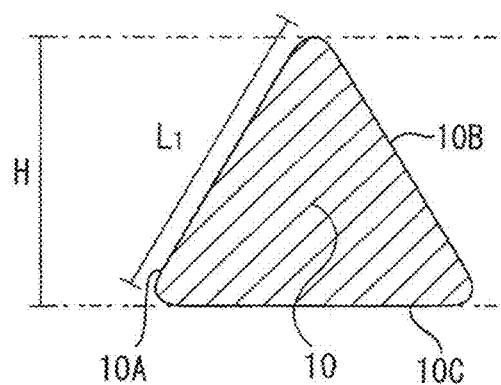 FIG.4B 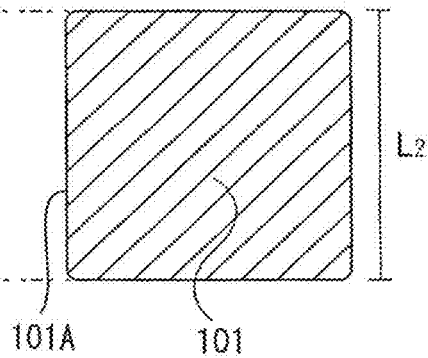
FIG.4C 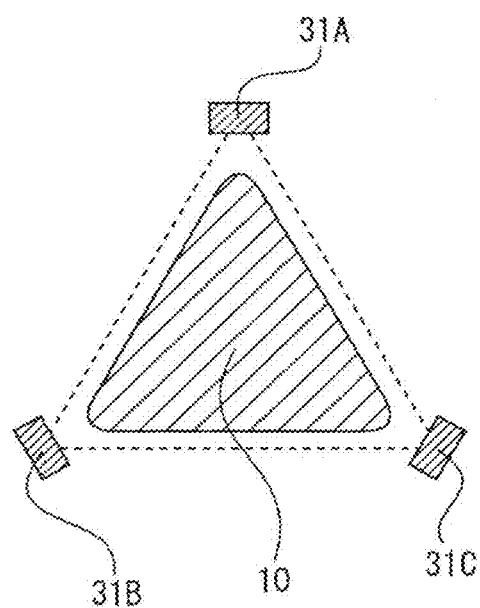 FIG.4D 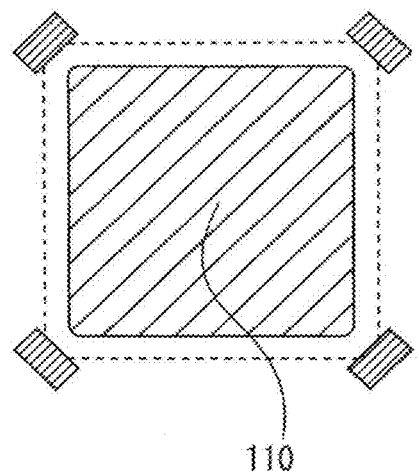

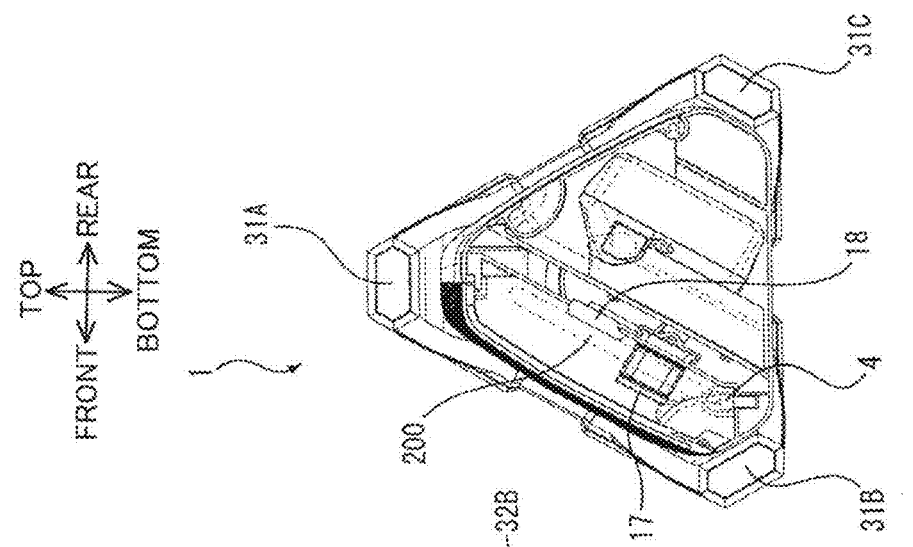
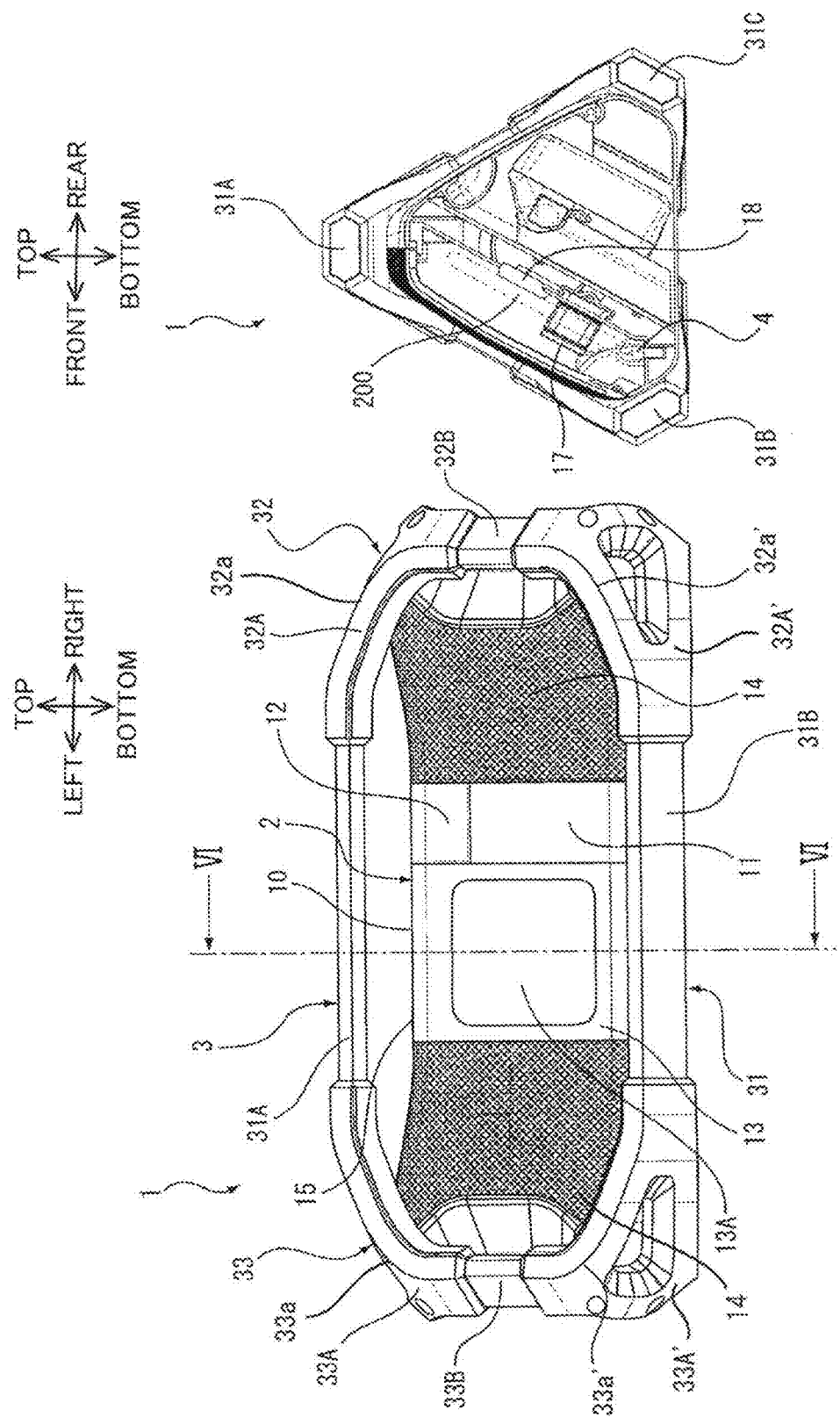

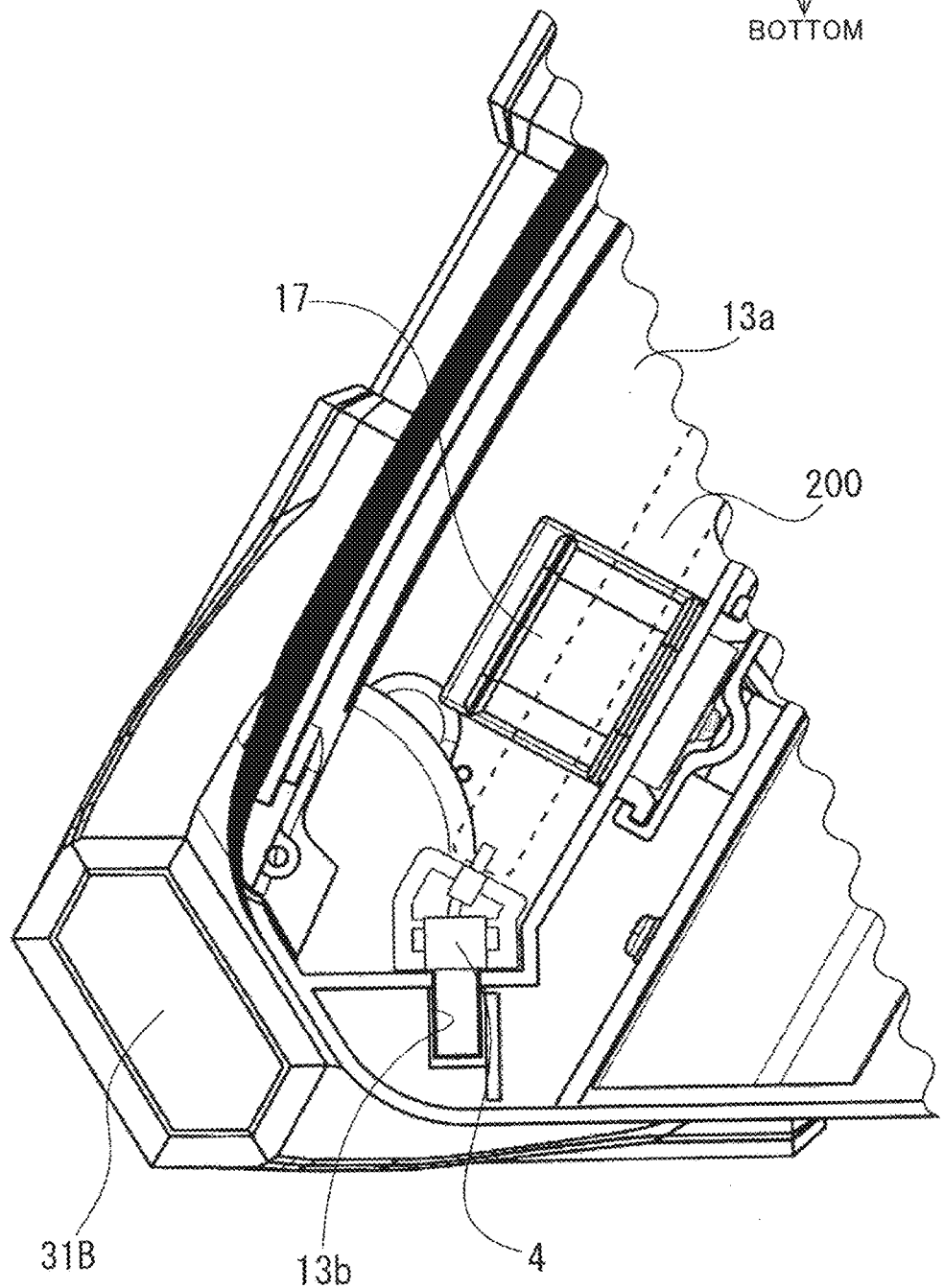

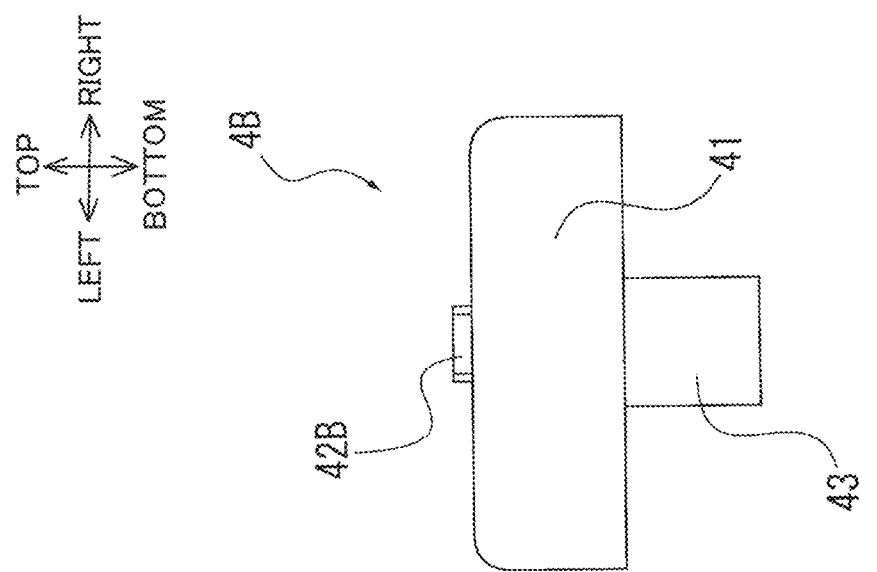
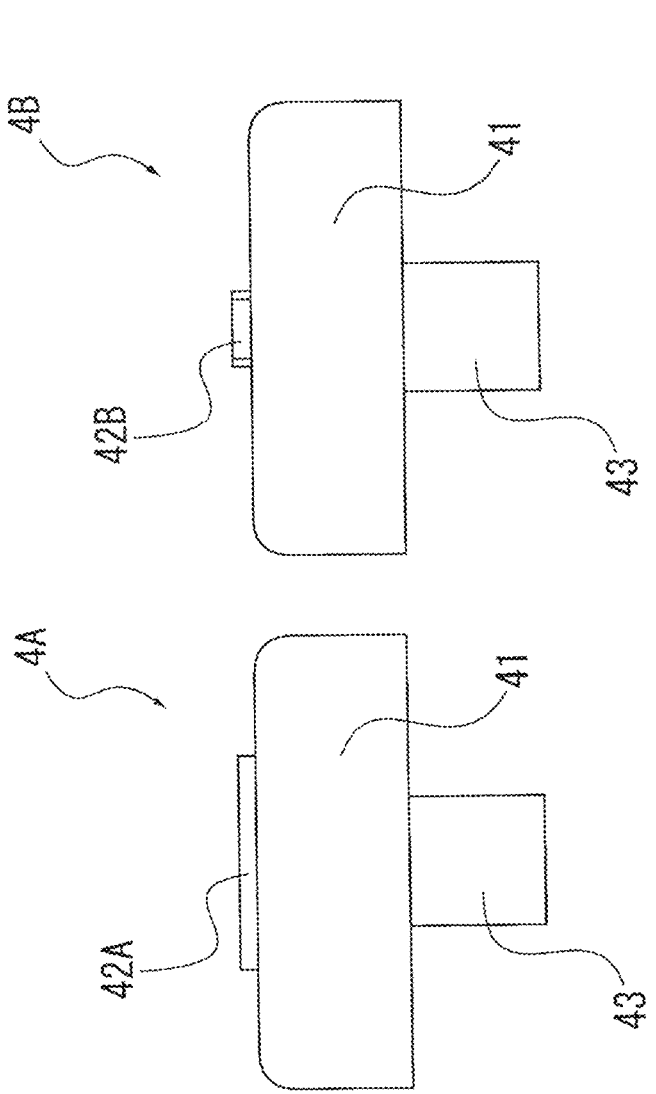
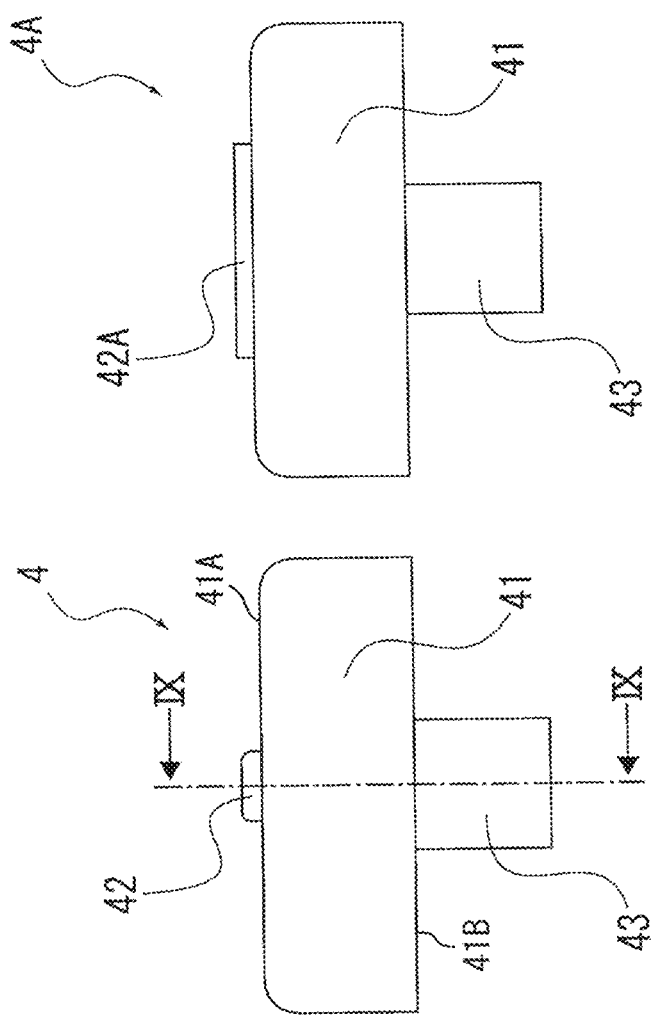

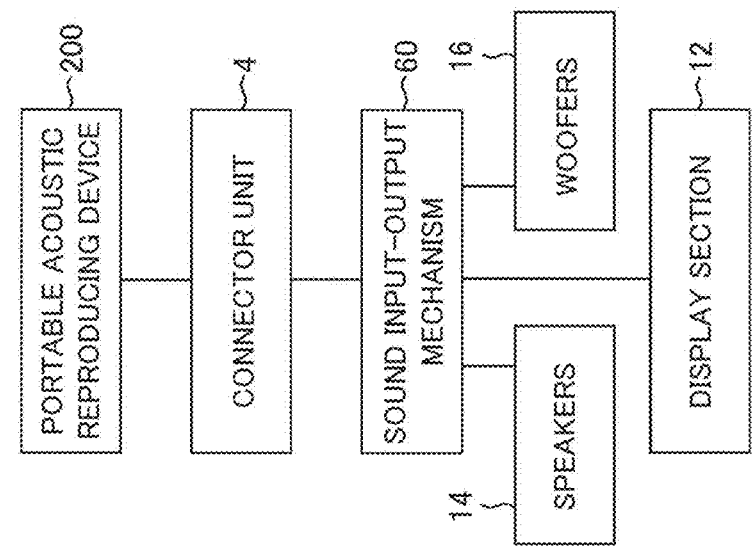
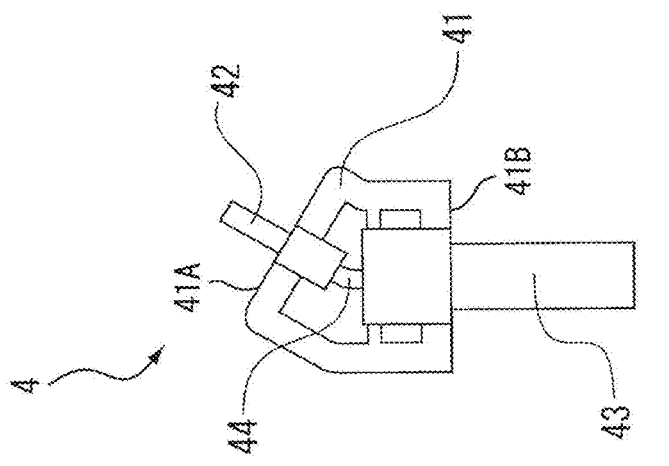
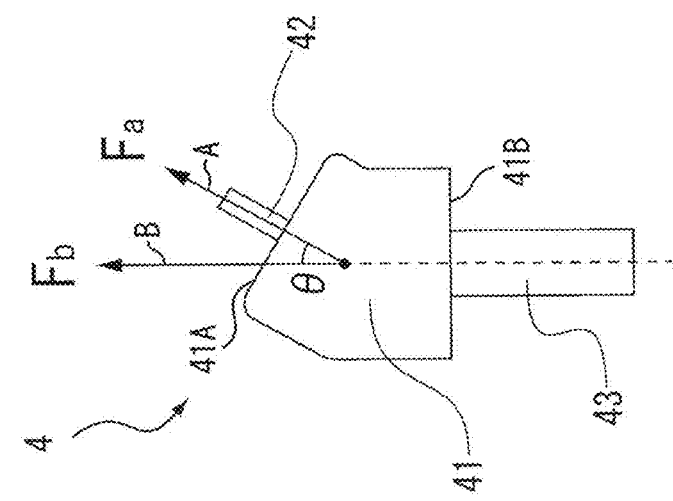

ELECTRIC DEVICE WITH SURROUNDING PROTECTIVE FRAME

CROSS REFERENCE TO RELATED APPLICATION

This application claims priority from Japanese Patent Applications No. 2013-125495 filed Jun. 14, 2013 and 2013-125988 filed Jun. 14, 2013. The entire content of each of these priority applications is incorporated herein by reference.

TECHNICAL FIELD

The present invention relates to a portable electric device, more specifically, to an acoustic device, such as a radio. The present invention also relates to a connector unit to be used in the electric device.

BACKGROUND

There may be a situation in which a portable electric device is brought to a workplace such as a construction site for enjoying music or a radio program while at work. Such a workplace at which the electric device is used has a lot of traffic of vehicles for conveying construction materials or people coming and going, so that a common electric device is easily broken due to user's carelessness, unexpected fall of construction materials, or collision against a wall or the like. Under such a circumstance, there is a need to improve endurance of the electric device against external impact.

In order to solve the above problem, there is proposed an electric device having a frame guard provided outside a device body of the electric device for the purpose of protection. The frame guard is formed by connecting bar-like guards disposed at positions corresponding to sides of the device body having a substantially cuboid shape (hereinafter referred to as a first conventional electric device).

Further, in recent years, a device for enjoying music, etc. becomes more varied with advent of a portable acoustic reproducing device, such as iPod® (iPod is a registered trademark of Apple, Incorporated), iPhone® (iPhone is a registered trademark of Apple, Incorporated), etc. Such a portable acoustic reproducing device has a sixe smaller than a radio that is conventionally known as a portable acoustic device (hereinafter referred to as a second conventional electric device). Now, there is a demand to enjoy music while at work by outputting, from the portable acoustic device, music stored in the portable acoustic reproducing device.

SUMMARY

However, in the first conventional electric device, the device body has an operation section on its front side, and the operation section protrudes further frontward than the guard of the frame guard in a plan view. If, in the construction site, a long timber or the like falls over the electric device, the operation section, which protrudes further frontward than the guard, may collide with the timber.

Further, in the first conventional electric device, each connection portion connecting the guards of the frame guard is angulated, so that if impact is applied to the connection portion, the applied impact cannot be reliably dispersed.

Further, the guards constituting the frame guard are disposed corresponding to the sides of the cuboid device body and, therefore, the frame guard has a quadrangular shape as viewed in a left-right direction of the device body. As a result, the number of the guards and the number of components such as connection members connecting the guards are increased to thereby increase the manufacturing cost.

Further, in the first conventional electric device, the operation section and a display section are disposed on a surface of the device body perpendicular to the ground, thus impairing operability and visibility of a user who operates the electric device while standing up.

In view of the foregoing, it is an object of the present invention to provide an electric, device satisfactorily protecting its device body against impact applied thereto. Further, another object of the present invention is to provide an electric device capable of reducing the number of components constituting a frame guard to suppress manufacturing cost, increase. Still another object of the present invention is to provide an electric device in winch an operation section and a display section provided at a device body is easily operated and viewed.

The second conventional electric device does not have a configuration for outputting music stored in the portable acoustic reproducing device therefrom. Further, since there exists a plurality of types of the portable acoustic reproducing devices, it is desired that an electric device (acoustic device) has a configuration that can be electrically connected to the portable acoustic reproducing device irrespective of the type of the portable acoustic reproducing device. Further, in a situation where a portable acoustic reproducing device is used by being connected to an electric device at a workplace, etc., there is a fear of breakage of the portable acoustic reproducing device due to application of external impact or intrusion of water droplets. Further, the workplace has a lot of traffic of vehicles for conveying construction materials or people coming and going, so that the portable acoustic reproducing device may be subject to damage or malfunction due to user's carelessness. Thus, it is desired that the connection between a portable acoustic reproducing device and an electric device can be made easily and simply, and it is necessary to protect the portable acoustic reproducing device from the external impact and the like.

In view of the foregoing, it is an object of the present invention to provide an acoustic device including a plurality of connecter units provided in one-to-one correspondence with a plurality of types of portable acoustic reproducing devices for selectively electrically connecting the acoustic device and any one of the plurality of types of portable acoustic reproducing devices in an exchangeable manner according to the selected type of portable acoustic reproducing device. Another object of the present invention is to provide an acoustic device capable of protecting the portable acoustic reproducing device mounted thereon.

In order to attain, the above and other objects, the present invention provides an electric device including: a device body; and a frame guard. The device body has a plurality of surfaces, for defining a three-dimensional configuration. The frame guard is configured to guard the device body, the frame guard is connected to the device body and disposed outside the device body. The plurality of surfaces is all disposed inside the frame guard.

According to another aspect, the present invention provides an electric device including: a device body; and a frame guard. The device body has a first dimension, in a top-bottom direction, a second dimension in a left-right direction, and a third dimension in a front-rear direction. The frame guard is configured, to guard the device body. The frame guard is connected to the device body and disposed outside, the device body. The frame guard includes: a first arcuate portion; and a second arcuate portion. The first arcuate portion has a left end and a right end in the left-right direction. The first arcuate portion is formed so as to be gradually decreased in dimension in the top-bottom direction, toward the left end and the right end, respectively. The second arcuate portion has a left end and a right end in the left-right direction. The second arcuate portion is formed so as to be gradually decreased in dimension in the front-rear direction, toward the left end and the right end, respectively.

According to still another aspect the present invention provides an electric device including: a device body; and a frame guard. The device body is elongated in a left-right direction. The frame guard is connected to the device body so as to be disposed further outward than the device body. The frame guard includes: a first guard portion elongated in the left-right direction and disposed above the device body; a second guard portion elongated in the left-right direction and disposed below and frontward the device body; and a third guard portion elongated in the left-right direction and disposed below and rearward of the device body.

According to still another aspect the present invention, provides an electric device including: a device body; an operation section; and a display section. The device body includes a frame. The frame has a bottom surface facing a horizontal plane when installed on the horizontal plane, and an inclined surface connected to the bottom surface. The inclined surface forms an acute angle with the bottom surface. The operation section is configured to perform operations for realizing functions of the device body. The operation, section is disposed at the inclined surface. The display section is configured to display information associated with the operations performed by the operation section. The display section is disposed at the inclined surface.

According to still another aspect, the present invention provides an acoustic device including: a frame; a sound input-output mechanism; and a connector unit. The frame defines an internal space and includes a mounting portion. In which one of a plurality of types of external portable acoustic reproducing devices is selectively and detachably mountable. The sound input-output mechanism is provided in the internal space and configured to input and output sound data stored in one of the plurality of types of external portable acoustic reproducing device selectively mounted in the frame. The connector unit comprises a plurality of types of connector units provided in one-to-one correspondence with the plurality of types of external portable acoustic reproducing devices. Each one of the plurality of types of connector units is configured to be detachably attached to the mounting portion. Each one of the plurality of types of connector units is configured to mount corresponding one of the plurality of types of external portable acoustic reproducing devices thereon and configured to electrically connect the corresponding one of the plurality of types of external portable acoustic reproducing devices and the sound input-output mechanism. The mounting portion is configured to store selected one of the plurality of types of external portable acoustic reproducing devices and one of the plurality of types of connector units corresponding to the selected one of the plurality of types of external portable acoustic reproducing devices in a state where the selected one of the plurality of types of external devices is mounted on the corresponding one of the plurality of types of connector units and electrically connected to the sound input-output mechanism through the corresponding one of the plurality of types of connector units.

According to still another aspect, the present invention provides a connector unit configured to connect an acoustic device and a portable acoustic reproducing device including: a seating portion; a first connection portion; and a second connection portion. The portable acoustic reproducing device is seated on the seating portion. The first connection portion extends from the seating portion. The first connection portion is configured to be electrically connected to the portable acoustic reproducing device seated on the seating portion. The second connection, portion extends from the seating portion at a position opposite to the first connecting portion with respect to the seating portion. The second connection portion is configured to be electrically connected to the acoustic device. The portable acoustic reproducing device and the acoustic device are electrically connected upon establishment of electric connection between the portable acoustic reproducing device and the first connection portion and establishment of electric connection between the acoustic device and the second connection portion.

BRIEF DESCRIPTION OF THE DRAWINGS

The particular features and advantages of the invention as well as other objects will become apparent from the following description taken in connection with the accompanying drawings, in which:

FIG. 2A is a from view of the electric device according to the embodiment;

FIG. 2B is a right side view of the electric device according to the embodiment;

FIGS. 4A through 4D are schematic views illustrating a relationship between a device body and a frame guard of the electric device, in which FIG. 4A is a schematic cross-sectional view of the device body of the electric device according to the embodiment; FIG. 4B is a schematic cross-sectional view of a device body of a conventional electric device; FIG. 4C is a schematic cross-sectional view of the device body, having a triangular shape in cross-section, of the electric device according to the embodiment, and FIG. 4D is a schematic cross-sectional view of a device body, having a quadrangular shape in a cross-section of an electric device according to a modification to the embodiment;

FIG. 6A is a front view of the electric device according to the embodiment;

FIG. 6B is a cross-sectional view of the electric device according to the embodiment, taken along a line VI-VI in FIG. 6A;

FIG. 7 is a partial enlarged view of the electric device according to the embodiment, in which a connector unit is particularly illustrated;

FIGS. 8A through 8C are from views illustrating the connector unit of the electric device according to the embodiment, in which FIG. 8A illustrates a connector unit for a first portable acoustic reproduction device; FIG. 8B illustrates a connector unit for a second portable acoustic reproduction device; and FIG. 8C illustrates a connector unit for a third portable reproduction device;

FIG. 9A is a right side view of the connector unit of FIG. 8A;

FIG. 9B is a cross-sectional view of the connector unit, taken along a line IX-IX in FIG. 8A; and FIG. 9C is a block diagram illustrating an electrical connection between the portable acoustic reproduction device and the electric device according to the embodiment.

DETAILED DESCRIPTION

Figure 1:
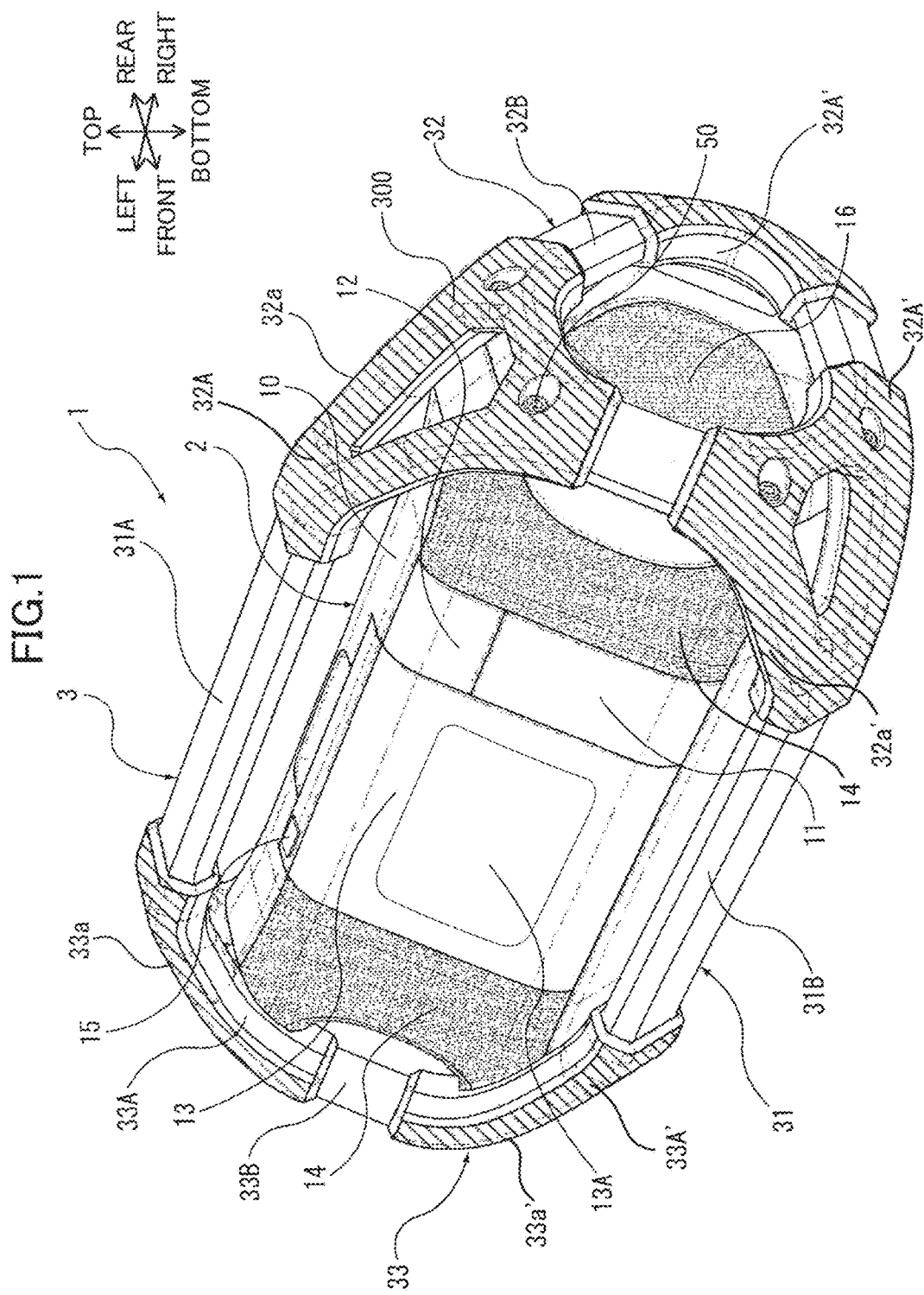
FIG. 1 is a perspective view of an electric device (acoustic device) according to one embodiment of the present invention.

A radio as an example of an electric device (acoustic device) according to one embodiment of the present invention will be described while referring to FIGS. 1 through 9C wherein like parts and components are designated by the same reference numerals to avoid duplicating description.

The radio 1 is used in a workplace such as a construction site.

In the following description, the terms "upward", "downward", "upper", "lower", "above", "below", "beneath", "right", "left", "front", "rear" and the like will be used assuming that the radio 1 is disposed in an orientation in which it is intended to be used. That is, directions related to the radio 1 will be given based on direction arrows shown in each drawing in order to simply explain a positional relationship between parts of the radio 1.

As illustrated in FIG. 1, the radio 1 includes a radio body 2 as an example of a device body, and a frame guard 3. The radio body 2 includes a frame 10 elongated in left-right direction when installed at the workplace. The frame 10 has a substantially triangular shape in cross-section taken, along an imaginary plane perpendicular to the left-right direction. As illustrated in FIG. 4A, the frame 10 has a front surface 10A, a rear surface 10B and a bottom, surface 10C.

The radio body 2 includes art operation section 11, a display section 12, a protection cover 13, and a pair of speakers 14. The operation section 11, the display section 12, the protection cover 13, and the pair of speakers 14 are disposed at the front surface 10A of the frame 10.

The pair of speakers 14 is adapted to output sound. The pair of speakers 14 is respectively disposed at left and right end portions of the frame 10 at its front surface 10A. That is, one of the pair of speakers 14 is disposed at the left end portion of the front surface 10A, and the other of the pair of speakers 14 is disposed at the right end portion of the. front surface 10A.

Hereinafter, the speaker 14 disposed at the left end portion of the front surface 10A will be referred to as the left speaker 14, and the speaker 14 disposed at the right end portion of the front surface 10A will be referred to as the right speaker 14 when it is necessary to distinguish between the two.

The operation section 11, the display section 12, and the protection cover 13 are positioned between the pair of speakers 14.

The operation section 11 is provided tor realizing various functions of the radio 1 and is provided with dials (not illustrated) and push switches (not illustrated).

The display section 12 is positioned above the operation section 11. The display section 12 is constituted by, e.g. a liquid crystal panel that displays information used for operating the radio 1. That is, the display section 12 is adapted to display information associated, with operations performed by the operation section 11.

The protection cover 13 is positioned between the left speaker 14 and the operation section 11. The protection cover 13 includes a transparent portion 13A. The protection cover 13 is provided so as to be pivotally movable between a closing position and so opening position about a lower end portion thereof (see FIGS. 1 and 5). In a state where the protection cover 13 is in the closing position, an outer surface of the operation section 11, an outer surface of the display section 12, and an outer surface of the protection cover 13 are substantially flush with each other. Hereinafter, unless otherwise specified, the protection cover 13 is assumed to be situated at the closing position as illustrated in FIG. 1.

As illustrated in FIG. 4A, the frame 10 has a substantially triangular shaped cross-section taken along an imaginary plane perpendicular to the left-right direction and, accordingly, the front surface 10A is inclined relative to a horizontal plane on which the bottom surface 10C is placed. That is, the front surface 10A makes an acute angle with the bottom surface 10C. The inclination of the front surface 10A at which the operation section 11 and the display section 12 are disposed makes it easy for a user working in a standing position to visually recognize the operation section 11 and the display section 12. Further, the operation section 11 and the display section 12 are disposed in an integrated manner at the front surface 10A. That is, the operation section 11 and the display section 12 are disposed at a single surface of the frame 10. Hence, the user can operate the radio 1 while checking only one surface, thus enhancing convenience of the user in operating the radio 1.

As illustrated in FIG. 4A, the frame 10 of the radio 1 has a substantially triangular shape in cross-section. The frame 10 has a height H in a top-bottom direction, and the front surface 10A of the frame 10 has a length L1. On the other hand, as illustrated in FIG. 4B, a frame 101 of a conventional radio has a substantially quadrangular shape in cross-section. The frame 101 has a height H in the top-bottom direction that is the same as the height H of the frame 10 of the radio 1, and a front surface 101A of the frame 101 has a length L2. When comparing the radio 1 with the conventional radio, the length L1 of the front surface 10A of the frame 10 is greater than the length L2 of the front surface 101A of the frame 101. That is, the front surface 10A at which the operation section 11 and the display section 12 are disposed can be increased in area as compared to the front surface 101A of the conventional radio. The increase in length of the front surface 10A allows increase in length of the operation section 11 and the display section 12. Thus, even a user wearing gloves can easily operate the operation section 11 and the display section 12, thus increasing convenience of the user in operating the radio 1.

A button 15 for opening and dosing the protection cover 13 is provided at a top surface of the frame 10. More Specifically, the button 15 is positioned at immediately above a left end portion of the protection cover 13. Pushing the button 15 can move the protection cover 13 to the opening position. In order to move the protection cover 13 to the closing position, the user pushes rearward the protection cover 13. Then, an engaging portion (not illustrated) provided in the protection cover 13 is brought into engagement with a receiving portion (not illustrated) provided in the button 15 to allow the protection cover 13 to be maintained at the closing position.

The radio body 2 further includes a pair of woofers 16 respectively disposed at left and right, side surfaces of the frame 10. That is, one of the pair of woofers 16 is disposed at the left side surface of the frame 10, and the other of the pair of woofers 16 is disposed at the right side surface of the frame 10. The pair of woofers 16 allows bass sounds to be outputted effectively. That is, the pair of woofers 16 allows low frequencies to be reproduced effectively.

The frame 10 has a storing portion (not illustrated) disposed at the bottom surface 10C. The storing portion (not illustrated) stores therein a power cable (not illustrated) through which an electric power is supplied from a commercial power source to the radio body 2. Further, a power supply battery (not illustrated) is provided in an internal, space defined by the frame 10. The radio body 2 is thus provided with both, the power cable (not illustrated) and the power supply battery (not illustrated), so that the user can select whether to use the power cable or the power supply battery depending on whether or not the commercial power supply is available at the workplace where fee radio 1 is used.

The radio body 2 further includes a sound input-output mechanism 60 (see FIG. 9C). The sound input-output mechanism 60 is disposed in the internal space defined by the frame 10. Through the sound input-output mechanism 60, sounds of radio broadcasting can be outputted from the pair of speakers 14 and the pair of woofers 16.

Figure 5:
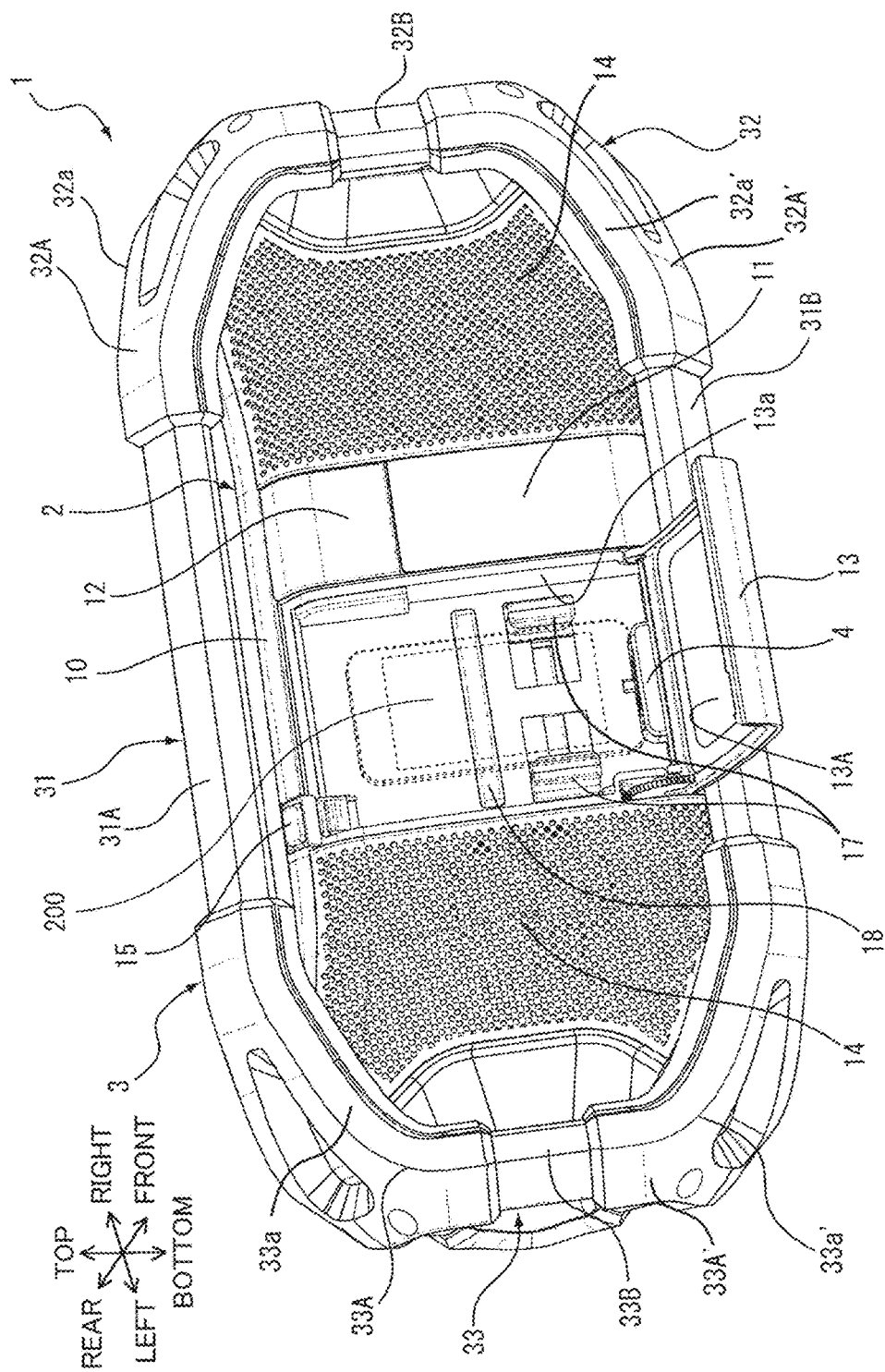
FIG. 5 is a perspective view of the electric device according to the embodiment in which a protection cover is opened.

As illustrated in FIGS. 5 and 7, the frame 10 has a mounting portion 13a at a position rearward of the protection cover 13 situated at the closing position. The mounting portion 13a is provided for mounting therein a portable acoustic reproducing device 200 as an example of an external portable acoustic reproducing device. The mounting portion 13a defines a space having a substantially quadrangular shape and recessed further inward than tie outer surfaces of the operation section 11 and the display section 12. A pair of holding portions 17 as an example of a holder and a cushioning portion 18 are provided in the mounting portion 13a. Farther, a connection groove 13b is formed in the mounting portion 13a.

As illustrated in FIG. 7, the connection groove 13b is recessed downward from a lower surface of the mounting portion 13a at a position substantially center thereof. The connection groove 13b allows a USB connector 43 (described later) of a connector unit 4 (described later) to be inserted thereinto and connected thereto. The connector unit 4 is formed so as to allow the portable acoustic reproducing device 200 to be placed thereon in a state where the USB connector 43 is inserted into the connection, groove 13b. The connector unit 4 is adapted to electrically connect the portable acoustic reproducing device 200 and the sound input-output mechanism 60.

As illustrated in FIG. 5. the cushioning portion 18 is provided at a substantially top-bottom center portion of the mounting portion 13a. The cushioning portion 18 is abuttable against a rear surface of the mounted portable acoustic reproducing device 200 to absorb and alleviate impact to be applied to the portable acoustic reproducing device 200 at mourning of the portable acoustic reproducing device 200 or during carrying of the radio 1.

The pair of holding portions 17 is provided adjacent to and below the cushioning portion 18. The pair of holding portions 17 is slidable in the left-right direction and adapted to hold the portable acoustic reproducing device 200 by sandwiching the portable acoustic reproducing device 200 from both the left and right sides thereof The portable acoustic reproducing device 200 is supported relative to the frame 10 by the pair of holding portions 17, thereby preventing the portable acoustic reproducing device 200 from separating or dropping from the mounting portion 13a when the radio 1 is carried with the portable acoustic reproducing device 200 being mounted in the mounting portion 13a, and also suppressing scratching of surfaces of the portable acoustic reproducing device 200 which is caused due to vibration of the portable acoustic reproducing device 200 with respect to the mounting portion 13a during carrying of the radio 1.

In a state where the protection, cover 13 is situated at the opening position, the portable acoustic reproducing device 200 can be mounted in and placed on the mounting portion 13a and can be removed from the mounting portion 13a. In a state where the protection cover 13 is situated at the closing position, the portable acoustic reproducing device 200 is protected from external dirt, dust or water, or external impact.

Further, since the protection cover 13 has the transparent portion 13A, the portable acoustic reproducing device 200 can be visually recognized from outside even in the state where the protection cover 13 is situated at the closing position. The user can check through the transparent portion 13A, a type of the mounted portable acoustic reproducing device 200 or an information, display section (not illustrated) of the portable acoustic reproducing device 200, as well as, can check whether or not file portable acoustic reproducing device 200 is being placed on the mounting portion 13a.

As illustrated in FIG. 9C, the portable acoustic reproducing device 200 and the sound input-output mechanism 60 are electrically connected to each other through the connector unit 4, whereby sound data of the portable acoustic reproducing device 200 is inputted to the sound input-output mechanism 60, and sound based on the sound data, such as music, is reproduced through the pair of speakers 14 and the pair of woofers 16.

The electrical connection between the portable acoustic reproducing device 200 and the sound input-output mechanism 60 through the connector unit 4 further allows the portable acoustic reproducing device 200 to be charged. In this case, the sound data of dm portable acoustic reproducing device 200 can be transmitted over a wireless LAN to the sound input-output mechanism 60.

The radio 1 includes the connector unit 4 detachably attached to the mounting portion 13a. As illustrated in FIGS. 8A, 9A, and 9B, the connector unit 4 has a easing 41 as an example of a seating portion, a terminal connection portion 42 as an example of a first connection, portion, the USB connecter 43 as an example of a second commotion portion, and a cable 44.

Directions related to the connector unit 4 will assume that the connector unit 4 is placed on the mounting portion 13a.

As illustrated in FIG. 9A, the casing 41 constitutes a main body of the connector unit 4. The casing 41 has an upper portion that is bent rearward at a substantially up-down center of the casing 41. The casing 41 has a left-right width designed to be substantially equal to a left-right width of the portable acoustic reproducing device 200, whereby the portable acoustic reproducing device 200 can be stably placed on the casing 41.

The terminal connection portion 42 extends in a direction perpendicular to an upper surface 41A of the casing 41 from a substantially center ox the upper surface 41A. The terminal connection portion 42 is configured to be electrically connected to the portable acoustic reproducing device 200.

The USB connector 43 extends in a direction perpendicular to a lower surface 41B of the casing 41 from a substantially center of the lower surface 41B. The lower surface 41B is a surface on an opposite to the upper surface 41A of the casing 41. The USB connector 43 is insertable and connectable to the connection, groove 13b. The USB connector 43 can be electrically connected to the sound input-output mechanism 60 upon insertion and connection to the connection groove 13b.

The cable 44 is provided inside the casing 41. The cable 44 is adapted to electrically connect the terminal connection portion 42 and the USB connector 43.

Since the upper portion of the casing 41 is bent rearward at the substantially up-down center of the casing 41, an extending direction of the terminal connection portion 42 and an extending direction of the USB connecter 43 intersects with each other. Accordingly, a direction in which, the connection between the terminal connection portion 42 and the portable acoustic reproducing device 200 is released is angled with respect to a direction in which the connection between the USB connector 43 and the sound input-output mechanism 60 is released. This arrangement can prevent the connection between the USB connector 43 and the sound input-output mechanism 60 from being unintentionally released when the connection between the terminal connection portion 42 and the portable acoustic reproducing device 200 is released.

More specifically, as illustrated in FIG. 9A, a force in a direction A to be applied to the connector unit 4 when the connection between the connector unit 4 and the portable acoustic reproducing device 200 is released is assumed to be a force Fa, and a force in a direction B required to .release, the connection between the connector unit 4 and the sound input-output mechanism 60 is assumed to be a force Fb, in which the force Fa and the force Fb are assumed to be substantially equal in magnitude.

When the portable acoustic reproducing device 200 is removed from the connector unit 4 with the force Fa, a force in the direction 8 to be applied to the connector unit 4 becomes a direction B component of the force Fa, i.e., $Fa\cos\theta$, which is smaller in magnitude than the force Fb in the direction B required to release the connection between rite connector unit 4 and the sound input-output mechanism 60. Providing an angle θ between the direction A and the direction B can suppress the connection between the connector unit 4 and the sound input-output mechanism 60 from being released when the connection between the portable acoustic reproducing device 200 and the Connector unit 4 is released.

FIG. 8A illustrates the connector unit 4 provided with the terminal connection portion 42 connectable to an external connection terminal of iPhone® 5 (iPhone is a registered trademark of Apple, Incorporated). FIG. 8B illustrates a connector unit 4A provided with a terminal connection portion 42A connectable to an external connection terminal of iPhone® 4. FIG. 8C illustrates a connector unit 4B provided with a terminal connection portion 42B connectable to an external connection terminal of an Android® (Android is a registered trademark of Google Incorporated) installed mobile device sues as a smartphone. In FIGS. 8A, 8B, and 8C, the terminal connection portions 42, 42A, and 42B of the respective connector units 4, 4A, and 4B have different shapes front each outer, while the USB connectors 43 thereof have the same shape.

By providing, as described above, the connector units 4, 4A, and 4B provided respectively with the terminal connection portions 42, 42A, and 42B each corresponding to one of a plurality of types of the portable acoustic reproducing devices 200 having different external connection terminals in terms of shape and specification, the user can appropriately select one of the connector units 4, 4A, and 4B according to the type of the portable acoustic reproducing device 200 used by the user, mount the selected one of the connector units 4, 4A, and 4B in the mounting portion 13a of the radio body 2. and electrically connect the portable acoustic reproducing device 200 to the sound input-output mechanism 60 through the selected one of the connector units 4, 4A, and 4B, Further, even in a case where a new specification of the external connection terminal of the portable acoustic reproducing device 200 appears in the future, it is only necessary to manufacture a connector unit provided with a terminal connection portion in conformity with the new specification.

Figure 3:
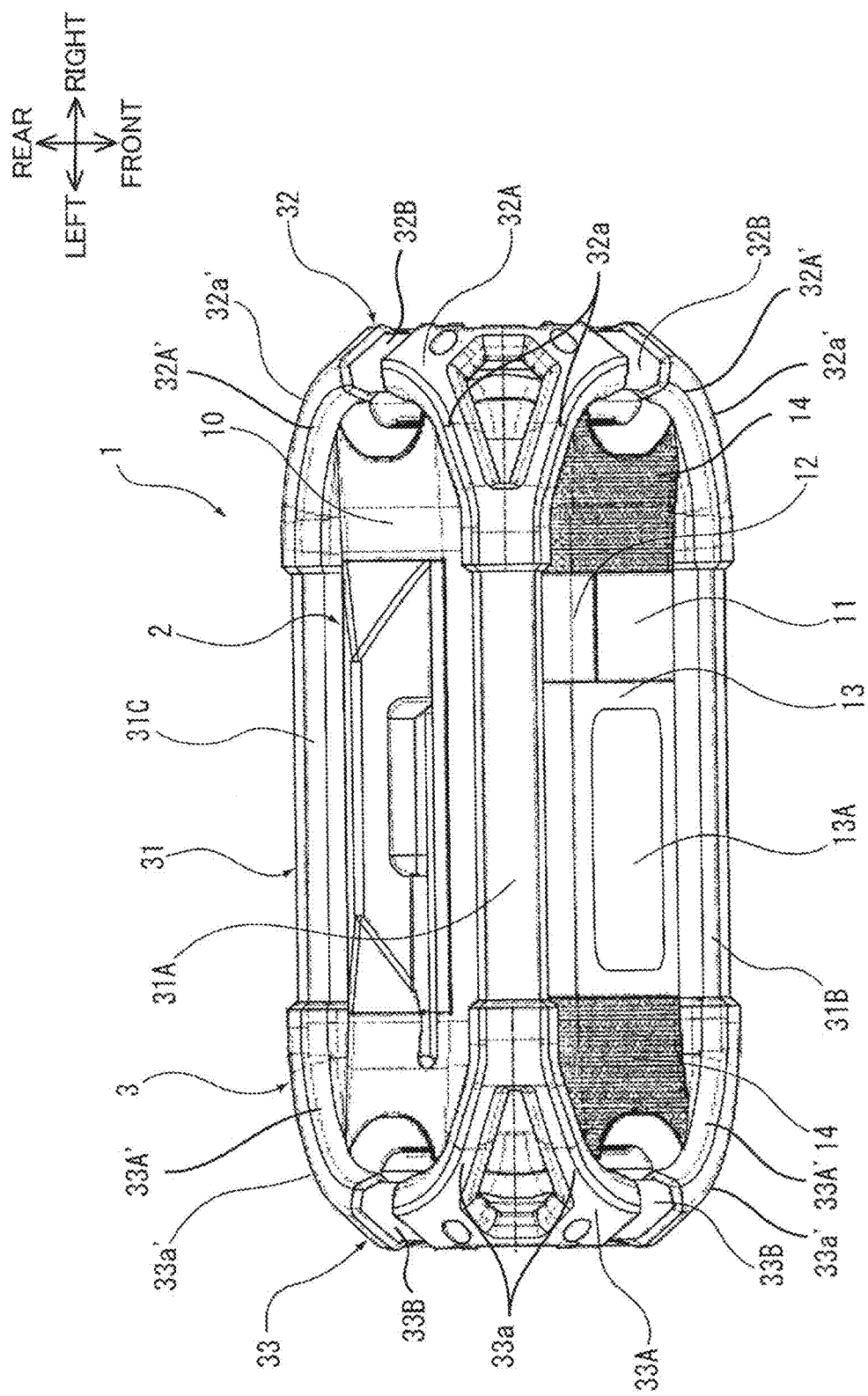
FIG. 3 is atop plan view of the electric device according to the embodiment.

As illustrated in FIGS. 1 to 3, the frame guard 3 includes a guard portion 31, a first connector 32, and a second connector 33.

The guard portion 31 constitutes a left-right center portion of the frame guard 3. The guard portion 31 includes a first guard 31A as an example of a first guard portion, a second guard 31B as an example of a second guard portion, and a third guard 31C as an example of a third guard portion. The first guard 31A, the second guard 31B, and the third guard 31C each have a hollow bar-like configuration and are made of aluminum. The first guard 31A is disposed above the radio body 2. The second guard 31B is disposed frontward of a bottom portion of the radio body 2, that is, disposed below and frontward of the radio body 2. The third guard 31C is disposed rearward of the bottom, portion of the radio body 2, that is, disposed below and rearward of the radio body 2.

The first connector 32 connects right end portions of the respective first guard 31A, second guard 31B, and third guard 31C to each other. The second connector 33 connects left end portions of the respective first guard 31A, second guard 31B, and third guard 31C to each other.

As illustrated in FIGS. 2B and 6B, the frame guard 3 has a substantially isosceles triangular shape, as viewed in the left-right direction, with, the first guard 31A as a vertex and a line segment connecting the second guard 31B and the third guard 31C as a base. The first connector 32 and the second connector 33 each have a substantially isosceles triangular shape as viewed in. the left-right direction.

As described above, the frame guard 3 has a substantially isosceles triangular shape as viewed in the left-right direction, so that three guards are required to constitute the guard portion 31. In the case of a conventional frame guard having a substantially quadrangular shape as viewed in the left-right direction, four frame guards are required to constitute a guard portion of the conventional frame guard. Hence, the number of the guards constituting the guard portion 31 can be reduced as compared to the conventional frame guard, which can in turn reduce the number of members constituting the first connector 32 and the number of members constituting the second connector 33. As a result, production cost of the frame guard 3 can be reduced.

As illustrated in FIGS. 1 and 2B, the first connector 32 constitutes a right end portion of the frame guard 3. The first connector 32 is formed into a substantially isosceles triangular shape as viewed in the left-right direction. The first connector 32 includes three connection members 32A, 32A', 32A' and three connection bars 32B. The second connector 33 constitutes a left end portion of the frame guard 3. The second connector 33 is formed into a substantially isosceles triangular shape as viewed in the left-right direction. The second connector 33 includes three connection members 33A, 33A', 33A' and three connection bars 33B. The second connecter 33 has a configuration substantially the same as that of the first connector 32. That is, the first connector 32 and the second connector 33 are arranged in left-right symmetry. Hence, only the first connector 32 will be described herein in detail.

The connection members 32A, 32A' and 32A' are each made of polypropylene (PP). The connection member 32A is disposed above the connection members 32A', 32A'. One of the connection member 32A', 32A' is disposed frontward of the other of the connection members 32A', 32A'. Hereinafter, the connection member 32A' disposed on the front side will be referred to as the front connection member 32A', and the connection member 32A' disposed on the rear side will he referred to as dm rear connection member 32A' when it is necessary to distinguish between the two.

The connection member 32A has two fitting holes with which the connection bars 32B are fitted, and one fitting hole with which a right end portion of the first guard 31A is fitted. The from connection members 32A' has two fitting holes with which the connection bars 32B are fitted, and one fitting hole with which a right end portion of the second guard 31B is fitted. The rear connection members 32A' has two fitting holes with which the connection bars 32B are fitted, and one fitting hole with which a right end portion of the third guard 31C is fitted.

The connection bars 32B are each made of aluminum and each have a hollow bar-like shape. Hereinafter, the connection bar 32B disposed on the front side will be referred to as the front connection bar 32B, the connection bar 32B disposed on the rear side will be referred to as the rear connection bar 32B, and the connection bar 32B disposed on the bottom side will be referred to as the bottom connection bar 32B when it is necessary to distinguish between the three.

The front connection bar 32B has one end portion fixedly fitted into the fitting hole formed in the connection member 32A, and another end portion fixedly fitted into the fitting hole formed in the front connection member 32A'. The rear connection bar 32B has one end portion fixedly fitted, into dm fitting hole formed in dm connection member 32A, and another end portion fixedly fitted into the fitting hole formed in the rear connection member 32A'. The bottom connection bar 32B has one end portion fixedly fitted, into the fitting hole formed in the front connection member 32A', and another end portion fixedly fitted into the fitting hole formed in the rear connection member 32A'. Hence, the connection members 32A, 32A', 32A' are connected to each other.

The right end portions of the first guard 31A, the second guard 31B, and the third guard 31C of the guard portion 31 are respectively fixedly tided into the fitting holes formed in the connection members 32A, 32A' and 32A', whereby the guard portion 31 and the first connector 32 are connected to each other.

Similarly, the left end portions of the first guard 31A, the second guard 31B. and the third guard 31C of the guard portion 31 are respectively fixedly fitted into tile fitting holes formed in the. connection members 33A, 33A' and 33A', whereby the guard portion 31 and the second connector 33 are connected to each other.

According to the above-described configuration, the first connector 32 has the three connection members 32A, 32A', 32A' and the three connection bars 32B, and is formed into a substantially isosceles triangular shape as viewed in the left-right direction. When the radio body 2 has an equilateral triangular shape in cross-section taken along an imaginary plane perpendicular to the left-right direction of the frame 10, the first connector 32 may be formed into a substantially equilateral triangular shape as viewed in the left-right direction. In this case, the three connection members 32A, 32A', 32A' used for producing the first connector 32 can be formed into the same shape. This can reduce the number of types of a member required for producing the frame guard 3, which in turn reduces the number of production processes to thereby allow cost reduction.

When the radio body 2 has a substantially equilateral triangular shape or a substantially isosceles triangular shape in cross-section taken along an imaginary plane perpendicular to the left-right direction of the frame 10, the first guard 31A is positioned substantially immediately above a gravity center position of the radio body 2 and thus suitable for use as a handle portion for carrying the radio 1. This facilitates carrying of the radio 1 without newly providing a handle portion. Further, by providing a soft material for alleviating burden on user's hand at a substantial center of the first guard 31A in the left-right direction or by forming a shape of a substantial center of the first guard 31A in the left-right direction info a shape fitting user's hand, carrying of the radio 1 is further facilitated.

As illustrated in FIGS. 1, 2A, 3, and 6A, the connection members 32A, 32A', 32A' include arcuate portions 32a, 32a', 32a', respectively. More specifically the connection member 32A includes two arcuate portions 32a, 32a, the front connection member 32A' includes two arcuate portions 32a', 32a', and the rear connection member 32A' includes two arcuate portions 32a', 32a'.

Each arcuate portion 32a of the connection member 32A (i.e., each of the front and rear arcuate portions 32a) is formed so as to curve downward toward its right end. One of the arcuate portions 32a' of the front connection member 32A' (i.e. the from arcuate portion 32a') is formed so as to curve upward toward its right end, and the other of the arcuate portions 32a' thereof (the bottom arcuate portion 32a') is formed so as to curve rearward toward its right end. One of the arcuate portions 32a' of the rear connection member 32A' (i.e., the rear arcuate portion 32a') is formed so as to curve upward toward its right end, and the other of the arcuate portions 32a' thereof (the bottom arcuate portion 32a') is formed so as to curve frontward toward its right end.

In other words, as viewed in a direction perpendicular to an imaginary plane containing the first guard 31A and the second guard 31B (referred to as a first viewing direction), the front arcuate portion 32a of the connection member 32A and the front arcuate portion 32a' of the from connection member 32A' are arranged to face each other so that a distance therebetween in a direction perpendicular to both the left-right direction and the first viewing direction is gradually decreased toward their right ends.

That is, the front arcuate portion 32a of the connection member 32A and the front arcuate portion 32a' of the front connection member 32A' are disposed outward of the first guard 31A and the second guard 31B in the left-right direction, and face the front surface 10A of the frame 10. The front arcuate portion 32a of the connection member 32A and the front arcuate portion 32a' of the front connection member 32A' define a distance therebetween in a direction connecting the first guard 31A and the second guard 31B, and this distance is gradually decreased toward the left-right outer ends (i.e., right ends) of the front arcuate portion 32a of the connection member 32A and the front arcuate portion 32a' of the front connection member 32A' as viewed in a direction perpendicular to an imaginary plane defined by the first guard 31A and the second guard 31B and lacing the front surface 10A of the frame 10.

Further, as viewed in a direction perpendicular to an imaginary plane containing the first guard 31A and the third guard 31C (referred to as a second viewing direction), the rear arcuate portion 32a of the connection member 32A and the rear arcuate portion 32a' of the rear connection member 32A' are arranged to lace each other so that a distance therebetween in a direction perpendicular to both the left-right direction and the second viewing direction is gradually decreased toward their right ends.

That is, the rear arcuate portion 32a of the connection member 32A and the rear arcuate portion 32a' of the rear connection member 32A' are disposed outward of the first guard 31A and the third guard 31C in the left-tight direction, and face the rear surface 10B of the frame 10. The rear arcuate portion 32a of the connection member 32A and the rear arcuate portion 32a' of the rear conception member 32A' define a distance therebetween in a direction connecting the first guard 31A and the third guard 31C, and this distance is gradually decreased toward the left-right outer ends (i.e., right ends) of the rear arcuate portion 32a of the connection member 32A and the rear arcuate portion 32a' of the rear connection member 32A' as viewed in a direction perpendicular to an imaginary plane defined by the first guard 31A and the third guard 31C and facing the rear surface 10B of the frame 10.

Further, as viewed in a direction perpendicular to an imaginary plane containing the second guard 31B and the third guard 31C (referred to as a third viewing direction), the bottom arcuate portion 32a' of the front connection, member 32a' and the bottom arcuate portion 32a' of the rear connection member 32a' are arranged to face each other so that a distance therebetween in a direction perpendicular to the left-right direction and the third viewing direction is gradually decreased toward their right ends.

That is, the bottom arcuate portion 32a' of the front connection member 32a' and the bottom arcuate portion 32a' of the rear connection member 32a' are disposed outward of the second guard 31B and the third guard 31C in the left-right direction, and face the bottom surface 10C of the frame 10. The bottom arcuate portion 32a' of the front connection member 32a' and the bottom arcuate portion 32a' of the rear connection member 32a' define a distance therebetween in a direction connecting the second guard 31B and the third guard 31C, and this distance is gradually decreased toward the left-right outer ends (i.e., right ends) of the bottom arcuate portion 32a of the front connection member 32a' and the bottom arcuate portion 32a' of the rear connection member 32a' as viewed in a direction perpendicular to an imaginary plane defined by the second guard 31B and the third guard 31C and facing the bottom surface 10C of the frame 10.

Note that a combination of the front, arcuate portion 32a of the connection member 32A and the front arcuate portion 32a' of the front connection member 32A'; and a combination of the rear arcuate portion 32a of the connection member 32A and the rear arcuate portion 32a' of the rear connection member 32A' are an example of a first arcuate portion; and a combination of the bottom axe ante portion 32a' of the front connection member 32a' and the bottom arcuate portion 32a' of the rear connection member 32a' is an example of a second arcuate portion.

Alternatively, a combination of the front arcuate portion 32a of the connection member 32A and the front arcuate portion 32a' of the front connection member 32A' is an example of a first arcuate portion; a combination of the rear arcuate portion 32a of the connection member 32A and the rear arcuate portion 32a' of the rear connection member 32A' is an example of a second arcuate portion; a combination of the bottom arcuate portion 32a' of the front connection member 32a' and the bottom arcuate portion 32a' of the rear connection member 32a' is an example of a third arcuate portion.

Similarly, the connection members 33A, 33A', 33A' include arcuate portions 33a, 33a', 33a', respectively. Since the second connector 33 has a configuration substantially the same as that of the first connector 32, and the first connector 32 and the second connector 33 are arranged in left-right symmetry, the arcuate portions 33a, 33a', 33a' are respectively formed substantially the same as the arcuate portion 32a, 32a', 32a'. Thus, detailed description of the arcuate portions 33a, 33a', 33a' will he omitted, Note that a combination of the front arcuate portion 33a of the connection member 33A and the front arcuate portion 33a' of the front connection member 33A'; and a combination of the rear arcuate portion 33a of the connection member 33A and the rear arcuate portion 33a' of the rear connection member 33A' are an example of a first arcuate portion; and a combination of the bottom arcuate portion 33a' of the front connection member 33a' and the bottom arcuate portion 33a' of the rear connection member 33a' is an example of a second arcuate portion.

Alternatively, a combination of the front arcuate portion 33a of the connection member 33A and the front arcuate portion 33a' of the front connection member 33A' is an example of a first arcuate portion; a combination of the rear arcuate portion 33a of the connection member 33A and the rear arcuate portion 33a' of the rear connection member 33A' is an example of a second arcuate portion; a combination of the bottom arcuate portion 33a' of the front connection, member 33a' and the bottom arcuate portion 33a' of the rear connection member 33a' is an example of a third arcuate portion.

The frame guard 3 has the arcuate portions 32a, 32a', 32a' and 33a, 33a', 33a', and, thus, when external impact is applied to the arcuate portions 32a, 32a', 32a' and 33a, 33a', 33a', the impact is dispersed to effectively alleviate the impact acting on the radio body 2. Further, the above configuration allows easy rolling of the radio 1, thereby alleviating the impact acting on the radio body 2.

As illustrated in FIG. 1, the connection members 32A, 32A', 32A' are each directly fixed to the radio body 2 by a plurality of screws 50. Similarly, the connection members 33A, 33A', and 33A' are each directly fixed to the radio body 2 by the plurality of screws 50. The frame guard 3 is thus fixed to the radio body 2.

It is acoustically considered that a configuration in which only a vibratory source (speaker cone) equipped in a speaker system to reproduce sound is vibrated, while a support member supporting the vibratory source is not vibrated is optimum for sound reproduction. There is available a method that increases a weight of the supporting member to suppress the vibration of the supporting member.

According to the above-described configuration, the radio body 2 is fixed to the frame guard 3 by the screws 50 and therefore cannot be moved relative to the frame guard 3. In the radio 1, the weight of the support member supporting the vibratory source corresponds to the sum of weights of the frame guard 3 and the radio body 2. Thus, as compared to a case where the weight of the support member corresponds to only the weight of the radio body 2, the weight of the support member is increased to enhance sound reproducibility. Further, the use of the screws 50 can facilitate fixing and assembling of the frame guard 3 to the radio body 2.

As illustrated in FIG. 4C, the radio body 2 is disposed within a substantially isosceles triangular area surrounded by the frame guard 3 as viewed in any cross-section taken along an imaginary plane perpendicular to the left-right direction. More specifically, the radio body 2 is disposed inside an isosceles triangle with the first guard 31A as a vertex and a line segment connecting the second guard 31B and the third guard 31C as a base as viewed in any cross-section taken along an imaginary plane perpendicular to the left-right direction. Further, as illustrated in FIGS. 1 through 3, any outer surfaces of the frame 10 of the radio body 2 are positioned inside the substantially isosceles triangular area surrounded by the frame guard 3. Thus, if a construction material like a long timber or the like falls over the radio 1, such a long timber collides first with the frame guard 3 to satisfactorily protect the radio body 2.

Further, the frame guard 3 includes an impact buffer 300. The impact buffer 300 is made of elastomer for absorbing external impact applied to the radio 1. The impact buffer 300 is provided by injection molding on a surface (hatched portion in FIG. 1) of each of the connection members 32A, 32A', 32A' and 33A, 33A', 33A' on an opposite side to a surface facing the radio body 2. That is, the impact buffer 300 is provided on outer surfaces of the connection members 32A, 32A', 32A' and 33A, 33A', 33A'. The connection members 32A, 32A', 32A' and 33A, 33A', 33A' have, so-called a two-layer mold structure.

When the radio 1 drops to the ground, or when, a construction material falls over the radio 1, the impact buffer 300 absorbs and alleviates impact to thereby protect the radio body 2 and the frame guard 3 themselves. Further, scratching or damage to the connection members 32A, 32A', 32A', and 33A, 33A', 33A' themselves can be suppressed, thereby avoiding the outer appearance of the radio 1 from being degraded. Further, when the radio 1 is placed on a floor or the like, the impact buffer 300 provided on the connection members 32A', 32A', and 33A', 33A' opposed to the floor abuts against the floor, thereby preventing the floor from being damaged.

The impact buffer 300 is provided so as to cover the outer surfaces of the connection members 32A, 32A', 32A' and 33A, 33A', 33A', respectively. That is, as viewed in the left-right direction, the impact buffer 300 protrudes further outward than the first guard 31A, the second guard 31B, and the third guard 31C in a direction away from the radio body 2. Therefore, when the radio 1 being carried collides with a wall or a floor, the impact buffer 300 collides with the wall or the floor in advance of the first guard 31A, the second guard 31B, and the third guard 31C. Thus, impact acting on the radio body 2 can be absorbed and alleviated by the impact buffer 300 to thereby protect the radio body 2, which can in turn prevent the first guard 31A, the second guard 31B, and the third guard 31C themselves from being scratched and damaged.

Various modifications are conceivable. In the following description, only parts differing front those of the embodiment will be described in detail.

In the above-described embodiment, the cross-section of the frame 10 taken along an imaginary plane perpendicular to the left-right direction, is a substantially triangular shape. However, the radio body 2 may have a frame 110 whose cross-section taken along an imaginary plane perpendicular to the left-right direction is a quadrangular shape as illustrated in FIG. 4D. In this case, four guards are required to constitute the guard portion 31 and disposed outside corner portions of the frame 110. The frame 110 is disposed inside an area surrounded by the four guards.

An additional storing portion for storing the plurality of connector units 4, 4A, and 4B may be provided at the rear surface 10B of the frame 10.

In the above-described embodiments the radio 1 is an example of an electric device (acoustic device). However, various types of electric devices (acoustic devices) other than the radio, such as a CD reproducing device, and a portable TV are applicable to the electric device (acoustic device).

While the present invention has been described in detail with reference to the embodiments thereof u would be apparent to those skilled in the art that various changes and modifications may be made therein without departing from the spirit of the present invention.

What is claimed is:

1. An electric device comprising:
   a device body elongated in a left-right direction; and
   a frame guard connected to the device body so as to be disposed further outward than the device body, the frame guard including:
   a first guard portion elongated in the left-right direction and disposed above the device body, the device body being disposed immediately below the first guard portion;
   a second guard portion elongated in the left-right direction and extending below and frontward of the device body; and
   a third guard portion elongated in the left-right direction and extending below and rearward of the device body,
   wherein the frame guard is in a form of a triangle shape as viewed in the left-right direction and defines a triangular prism volume surrounded by the frame guard, and
   wherein the device body in its entirety is disposed inside the triangular prism volume as viewed in the left right direction.

2. The electric device as claimed in claim 1, wherein:
   the first guard portion defines an upper edge of the triangular prism volume; and
   the second guard portion and the third guard portion define a base face of the triangular prism volume.

3. The electric device as claimed in claim 2, wherein the first guard portion has a left end and a right end in the left-right direction, the second guard portion has a left end and a right end in the left-right direction, and the third guard portion has a left end and a right end in the left-right direction,
   wherein the frame guard further includes:
   a first connector configured to connect the right end of the first guard portion, the right end of the second guard portion and the right end of the third guard portion; and
   a second connector configured to connect the left end of the first guard portion, the left end of the second guard portion, and the left end of the third guard portion.

4. The electric device as claimed in claim 3, wherein the first connector is in a form of an equilateral triangle as viewed in the left-right direction, and the second connector is in a form of an equilateral triangle as viewed in the left-right direction.

5. The electric device as claimed in claim 1, wherein the first guard portion includes a handle portion configured to be held by a user.

6. The electric device as claimed in claim 1, wherein the device body has a first surface, a second surface and a third surface each elongated in the left-right direction,
   wherein the device body includes:
   an operation section configured to perform operations for realizing functions of the device body; and
   a display section configured to display information associated with the operations performed by the operation section, wherein the first guard portion and the second guard portion define an imaginary plane facing the first surface, wherein the device body has a triangle shape as viewed in the left-right direction, at least one of the operation section and the display section being disposed at the first surface.

7. The electric device as claimed in claim 6, wherein the operation section and the display section are disposed at the first surface.

8. The electric device as claimed in claim 1, wherein the first guard portion is disposed above a substantially center of the device body in a front-rear direction.

9. An electric device comprising:
a frame elongated in a left-right direction and having a bottom side configured to be placed on a horizontal surface;
a device body integrally connected to the frame, the device body having an inclined surface oriented at a fixed acute angle relative to the bottom side of the frame, the device body including:
an operation section configured to perform operations for realizing functions of the device body, the operation section being disposed at the inclined surface; and
a display section configured to display information associated with the operations performed by the operation section, the display section being disposed at the inclined surface.

10. The electric device as claimed in claim 9, wherein the frame comprises a front side and a rear side,
wherein the frame has a triangle shape in cross-section defined by the bottom side, the front side, and the rear side.

11. An acoustic device comprising:
a frame defining an internal space and including a protection cover; only one acoustic device mounting portion provided in the internal space and in which any one of a plurality of different types of external portable acoustic reproducing devices is selectively and detachably mountable, each of the different types of external portable acoustic reproducing devices having a respective different type of output port;
a sound input-output mechanism provided in the internal space and including an output portion configured to output sound generated via an acoustic reproducing device mounted to the acoustic device mounting portion and an input portion
operatively connected to the output portion; and
a connector unit mounting portion provided in the internal space and configured to accommodate a connector unit operatively connecting the output port of an acoustic reproducing device mounted to the acoustic device mounting portion to the input portion of the sound input-output mechanism, the connector unit mounting portion being configured to accommodate any one of a connector unit comprising a plurality of different types of connector units provided in one-to-one correspondence with the plurality of the different types of external portable acoustic reproducing devices; the protection cover being configured to protect an acoustic reproducing device mounted to the acoustic device mounting portion and a connector unit accommodated in the connector unit mounting portion from at least any one of external dirt, dust, and impact.

12. The acoustic device as claimed in claim 11, wherein the protection cover includes a transparent portion configured to an acoustic reproducing device mounted to the acoustic device mounting portion to be visually recognized from outside.

13. The acoustic device as claimed in claim 11, further comprising at least one of the plurality of different types of connector units, each of the plurality of different types of connector units having a respective different type of terminal connection portion.

14. The acoustic device as claimed in claim 13, wherein the at least one of the plurality of different types of connector units includes a casing having a support surface configured to interface with an acoustic reproducing device connected to the connector unit to support the acoustic reproducing device.

15. The acoustic device as claimed in claim 14, wherein the support surface has a left-right width substantially equal to a left-right width of the acoustic reproducing device.

16. The acoustic device as claimed in claim 11, wherein the input portion comprises a universal serial bus (USB) port.

* * * * *